United States Patent
Bettencourt et al.

(10) Patent No.: US 8,419,959 B2
(45) Date of Patent: Apr. 16, 2013

(54) CLAMPED MONOLITHIC SHOWERHEAD ELECTRODE

(75) Inventors: Gregory R. Bettencourt, Fremont, CA (US); Gautam Bhattacharyya, San Ramon, CA (US); Simon Gosselin Eng., Fremont, CA (US); Sandy Chao, Sunol, CA (US); Anthony de la Llera, Fremont, CA (US); Pratik Mankidy, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 396 days.

(21) Appl. No.: 12/884,269

(22) Filed: Sep. 17, 2010

(65) Prior Publication Data

US 2011/0070740 A1 Mar. 24, 2011

Related U.S. Application Data

(60) Provisional application No. 61/243,647, filed on Sep. 18, 2009.

(51) Int. Cl.
| | |
|---|---|
| *C03C 15/00* | (2006.01) |
| *C03C 25/68* | (2006.01) |
| *H01L 21/302* | (2006.01) |
| *H01L 21/461* | (2006.01) |
| *C23F 1/00* | (2006.01) |
| *H01L 21/306* | (2006.01) |

(52) U.S. Cl.
USPC .................. 216/67; 438/710; 156/345.34

(58) Field of Classification Search ............ 216/67
See application file for complete search history.

(56) References Cited

U.S. PATENT DOCUMENTS

| | | | |
|---|---|---|---|
| 4,585,920 A | 4/1986 | Hoog et al. |
| 4,612,077 A | 9/1986 | Tracy et al. |
| 4,908,095 A | 3/1990 | Kagatsume et al. |
| 5,074,456 A | 12/1991 | Degner et al. |
| 5,200,016 A | 4/1993 | Namose |
| 5,356,515 A | 10/1994 | Tahara et al. |
| 5,423,936 A | 6/1995 | Tomita et al. |

(Continued)

FOREIGN PATENT DOCUMENTS

| | | |
|---|---|---|
| JP | 56-087667 A1 | 7/1981 |
| JP | 07-066180 A | 3/1995 |

(Continued)

OTHER PUBLICATIONS

Commonly owned U.S. Appl. No. 61/036,862, filed Mar. 14, 2008.

(Continued)

*Primary Examiner* — Binh X Tran
*Assistant Examiner* — Thomas Pham
(74) *Attorney, Agent, or Firm* — Buchanan Ingersoll & Rooney PC

(57) ABSTRACT

An electrode assembly for a plasma reaction chamber used in semiconductor substrate processing. The assembly includes an upper showerhead electrode which is mechanically attached to a backing plate by a series of spaced apart cam locks. A guard ring surrounds the backing plate and is movable to positions at which openings in the guard ring align with openings in the backing plate so that the cam locks can be rotated with a tool to release locking pins extending from the upper face of the showerhead electrode.

20 Claims, 10 Drawing Sheets

U.S. PATENT DOCUMENTS

| | | | |
|---|---|---|---|
| D363,464 S | 10/1995 | Fukasawa | |
| 5,500,256 A | 3/1996 | Watabe et al. | |
| 5,534,751 A | 7/1996 | Lenz et al. | |
| 5,569,356 A | 10/1996 | Lenz et al. | |
| 5,589,002 A | 12/1996 | Su | |
| 5,590,975 A | 1/1997 | Horntvedt | |
| 5,593,540 A | 1/1997 | Tomita et al. | |
| 5,614,026 A | 3/1997 | Williams | |
| 5,624,498 A | 4/1997 | Lee et al. | |
| 5,740,009 A | 4/1998 | Pu et al. | |
| 5,746,875 A | 5/1998 | Maydan et al. | |
| 5,766,364 A | 6/1998 | Ishida et al. | |
| 5,792,269 A | 8/1998 | Deacon et al. | |
| D411,516 S | 6/1999 | Imafuku et al. | |
| D412,513 S | 8/1999 | Ooyabu | |
| 5,959,409 A | 9/1999 | Dornfest et al. | |
| 5,993,597 A | 11/1999 | Saito et al. | |
| 5,997,649 A | 12/1999 | Hillman | |
| D420,022 S | 2/2000 | Burkhart et al. | |
| 6,024,799 A | 2/2000 | Chen et al. | |
| 6,036,782 A | 3/2000 | Tanaka et al. | |
| 6,039,836 A | 3/2000 | Dhindsa et al. | |
| 6,050,216 A | 4/2000 | Szapucki et al. | |
| 6,050,506 A | 4/2000 | Guo et al. | |
| D425,919 S | 5/2000 | Burkhart et al. | |
| 6,079,356 A | 6/2000 | Umotoy et al. | |
| 6,086,710 A | 7/2000 | Miyashita et al. | |
| 6,110,287 A | 8/2000 | Arai et al. | |
| 6,110,556 A | 8/2000 | Bang et al. | |
| 6,132,512 A | 10/2000 | Horie et al. | |
| 6,170,432 B1 | 1/2001 | Szapucki et al. | |
| 6,173,673 B1 | 1/2001 | Golovato et al. | |
| 6,200,415 B1 | 3/2001 | Maraschin | |
| 6,206,972 B1 | 3/2001 | Dunham | |
| D441,348 S | 5/2001 | Todd et al. | |
| 6,228,208 B1 | 5/2001 | Lill et al. | |
| 6,237,528 B1 | 5/2001 | Szapucki et al. | |
| 6,302,964 B1 | 10/2001 | Umotoy et al. | |
| 6,368,450 B2 | 4/2002 | Hayashi | |
| 6,389,677 B1 | 5/2002 | Lenz | |
| 6,391,787 B1 | 5/2002 | Dhindsa et al. | |
| 6,432,261 B2 | 8/2002 | Watanabe et al. | |
| 6,444,037 B1 | 9/2002 | Frankel et al. | |
| 6,461,435 B1 | 10/2002 | Littau et al. | |
| 6,477,980 B1 | 11/2002 | White et al. | |
| 6,495,233 B1 | 12/2002 | Shmurun et al. | |
| 6,506,686 B2 | 1/2003 | Masuda et al. | |
| 6,550,126 B1 | 4/2003 | Szettella et al. | |
| 6,553,932 B2 | 4/2003 | Liu et al. | |
| 6,558,506 B1 | 5/2003 | Freeman et al. | |
| 6,586,886 B1 | 7/2003 | Katz et al. | |
| 6,653,734 B2 | 11/2003 | Flanner et al. | |
| 6,723,202 B2 | 4/2004 | Nagaiwa et al. | |
| D490,450 S | 5/2004 | Hayashi et al. | |
| 6,753,498 B2 | 6/2004 | Sirkis et al. | |
| D493,873 S | 8/2004 | Hayashi | |
| 6,786,175 B2 | 9/2004 | Dhindsa et al. | |
| 6,818,096 B2 | 11/2004 | Barnes et al. | |
| 6,827,815 B2 | 12/2004 | Hytros et al. | |
| 6,872,258 B2 | 3/2005 | Park et al. | |
| 6,899,786 B2 | 5/2005 | Senzaki et al. | |
| 6,936,135 B2 | 8/2005 | Antolik | |
| 6,942,753 B2 | 9/2005 | Choi et al. | |
| 7,083,702 B2 | 8/2006 | Blonigan et al. | |
| 7,159,537 B2 | 1/2007 | Wickramanayaka et al. | |
| 7,166,200 B2 | 1/2007 | Saigusa et al. | |
| 7,196,283 B2 | 3/2007 | Buchberger, Jr. et al. | |
| 7,270,713 B2 | 9/2007 | Blonigan et al. | |
| 7,296,534 B2 | 11/2007 | Fink | |
| 2001/0000104 A1 | 4/2001 | Li et al. | |
| 2002/0048963 A1 | 4/2002 | Campbell et al. | |
| 2002/0139479 A1 | 10/2002 | Antolik | |
| 2002/0179245 A1 | 12/2002 | Masuda et al. | |
| 2003/0127806 A1 | 7/2003 | Belchuk | |
| 2003/0185729 A1 | 10/2003 | Ko et al. | |
| 2004/0074609 A1 | 4/2004 | Fischer et al. | |
| 2004/0108301 A1 | 6/2004 | Hao et al. | |
| 2004/0173313 A1 | 9/2004 | Beach | |
| 2005/0056218 A1* | 3/2005 | Sun et al. ............... 118/715 |
| 2005/0116427 A1 | 6/2005 | Seidel et al. | |
| 2005/0133160 A1 | 6/2005 | Kennedy et al. | |
| 2005/0150456 A1 | 7/2005 | Senzaki et al. | |
| 2005/0241765 A1 | 11/2005 | Dhindsa et al. | |
| 2005/0276928 A1 | 12/2005 | Okumura et al. | |
| 2006/0000803 A1 | 1/2006 | Koshiishi et al. | |
| 2006/0016559 A1 | 1/2006 | Kobayashi et al. | |
| 2006/0037701 A1 | 2/2006 | Koshiishi et al. | |
| 2006/0042754 A1 | 3/2006 | Yoshida et al. | |
| 2006/0043067 A1 | 3/2006 | Kadkhodayan et al. | |
| 2006/0066247 A1 | 3/2006 | Koshiishi et al. | |
| 2006/0075969 A1 | 4/2006 | Fischer | |
| 2006/0090704 A1 | 5/2006 | Ide et al. | |
| 2006/0108069 A1 | 5/2006 | Gernert | |
| 2006/0207502 A1 | 9/2006 | Dhindsa et al. | |
| 2006/0236934 A1 | 10/2006 | Choi et al. | |
| 2006/0283551 A1 | 12/2006 | Son | |
| 2006/0283552 A1 | 12/2006 | Rogers | |
| 2007/0032081 A1 | 2/2007 | Chang et al. | |
| 2007/0044716 A1 | 3/2007 | Tetsuka et al. | |
| 2007/0068629 A1 | 3/2007 | Shih et al. | |
| 2007/0131350 A1 | 6/2007 | Ricci et al. | |
| 2007/0181868 A1 | 8/2007 | Fujiwara et al. | |
| 2007/0187038 A1 | 8/2007 | Ren et al. | |
| 2007/0215580 A1 | 9/2007 | Koshiishi et al. | |
| 2007/0235660 A1 | 10/2007 | Hudson | |
| 2007/0284045 A1 | 12/2007 | Fischer et al. | |
| 2007/0284246 A1 | 12/2007 | Keii et al. | |
| 2008/0087641 A1 | 4/2008 | La Llera et al. | |
| 2008/0090417 A1 | 4/2008 | La Llera et al. | |
| 2008/0099120 A1 | 5/2008 | Larson et al. | |
| 2008/0141941 A1 | 6/2008 | Augustino et al. | |
| 2008/0227301 A1 | 9/2008 | Fang et al. | |
| 2008/0308228 A1 | 12/2008 | Stevenson et al. | |
| 2008/0308229 A1 | 12/2008 | Patrick et al. | |
| 2009/0081878 A1 | 3/2009 | Dhindsa | |
| 2009/0095220 A1* | 4/2009 | Meinhold et al. ............ 118/712 |
| 2009/0095424 A1 | 4/2009 | Bettencourt et al. | |
| 2009/0163034 A1 | 6/2009 | Larson et al. | |
| 2009/0223932 A1 | 9/2009 | Hida et al. | |
| 2009/0236040 A1 | 9/2009 | Patrick et al. | |
| 2010/0000683 A1 | 1/2010 | Kadkhodayan et al. | |
| 2010/0003824 A1 | 1/2010 | Kadkhodayan et al. | |
| 2010/0003829 A1 | 1/2010 | Patrick et al. | |
| 2010/0038033 A1 | 2/2010 | Hardin et al. | |
| 2010/0196625 A1* | 8/2010 | Yoon et al. ............... 427/569 |
| 2010/0252197 A1 | 10/2010 | Kadkhodayan et al. | |
| 2010/0261354 A1 | 10/2010 | Bettencourt et al. | |

FOREIGN PATENT DOCUMENTS

| | | |
|---|---|---|
| JP | 09-013172 A | 1/1997 |
| JP | 09-245994 | 9/1997 |
| JP | 2001085398 A | 3/2001 |
| JP | 2002-198353 A | 7/2002 |
| WO | WO 03/036680 A1 | 5/2003 |
| WO | WO2009/114175 A2 | 9/2009 |

OTHER PUBLICATIONS

Commonly owned U.S. Appl. No. 11/896,375, filed Aug. 31, 2007 now U.S. Publication No. 2008/0308228A1, published Dec. 18, 2008.

Commonly owned U.S. Appl. No. 12/216,526, filed Jul. 7, 2008 now U.S. Publication No. 2010/0003824A1, published Jan. 7, 2010.

Commonly owned U.S. Appl. No. 12/216,524, filed Jul. 7, 2008 now U.S. Publication No. 2010/0003829A1, published Jan. 7, 2010.

Commonly owned U.S. Appl. No. 12/216,525, filed Jul. 7, 2008 now U.S. Publication No. 2010/0000683A1, published Jan. 7, 2010.

Commonly owned U.S. Appl. No. 12/421,845, filed Apr. 10, 2009, now U.S. Publication No. 2010/0261354A1, published Oct. 14, 2010.

Commonly owned U.S. Appl. No. 12/419,878, filed Apr. 7, 2009, now U.S. Publication No. 2010/0252197, published Oct. 7, 2010.

Commonly Owned U.S. Appl. No. 12/875,869, filed Sep. 3, 2010.

Commonly Owned U.S. Appl. No. 12/903,412, filed Oct. 13, 2010.
Commonly Owned U.S. Appl. No. 12/884,269, filed Sep. 17, 2010.
Commonly Owned U.S. Appl. No. 12/872,980, filed Aug. 31, 2010.
Commonly Owned U.S. Appl. No. 12/872,982, filed Aug. 31, 2010.
Commonly Owned U.S. Appl. No. 12/872,984, filed Aug. 31, 2010.
Official Action dated Jan. 22, 2010 for Chinese Patent Appln. No. 201020114128.8.
International Search Report and Written Opinion mailed Feb. 24, 2010 for PCT/US2009/003953.
Search and Examination Report dated May 26, 2011 for Singapore Appln. No. 201006850-0.

* cited by examiner

CLAMPED MONOLITHIC SHOWERHEAD ELECTRODE

This application claims priority under 35 U.S.C. §119 to U.S. Provisional Application No. 61/243,647 entitled CLAMPED MONOLITHIC SHOWERHEAD ELECTRODE, filed Sep. 18, 2009, the entire content of which is hereby incorporated by reference.

BACKGROUND

The fabrication of an integrated circuit chip typically begins with a thin, polished slice of high-purity, single-crystal semiconductor material substrate (such as silicon or germanium) called a "wafer." Each wafer is subjected to a sequence of physical and chemical processing steps that form the various circuit structures on the wafer. During the fabrication process, various types of thin films may be deposited on the wafer using various techniques such as thermal oxidation to produce silicon dioxide films, chemical vapor deposition to produce silicon, silicon dioxide, and silicon nitride films, and sputtering or other techniques to produce other metal films.

After depositing a film on the semiconductor wafer, the unique electrical properties of semiconductors are produced by substituting selected impurities into the semiconductor crystal lattice using a process called doping. The doped silicon wafer may then be uniformly coated with a thin layer of photosensitive, or radiation sensitive material, called a "resist." Small geometric patterns defining the electron paths in the circuit may then be transferred onto the resist using a process known as lithography. During the lithographic process, the integrated circuit pattern may be drawn on a glass plate called a "mask" and then optically reduced, projected, and transferred onto the photosensitive coating.

The lithographed resist pattern is then transferred onto the underlying crystalline surface of the semiconductor material through a process known as etching. Vacuum processing chambers are generally used for etching and chemical vapor deposition (CVD) of materials on substrates by supplying an etching or deposition gas to the vacuum chamber and application of a radio frequency (RF) field to the gas to energize the gas into a plasma state.

A reactive ion etching system typically consists of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as $CF_4$, $CHF_3$, $CClF_3$, HBr, $Cl_2$ and $SF_6$ or mixtures thereof with $O_2$, $N_2$, He or Ar is introduced into the etching chamber and maintained at a pressure which is typically in the millitorr range. The upper electrode is a showerhead electrode provided with gas outlet(s), which permit the gas to be uniformly dispersed through the electrode into the chamber. The electric field established between the anode and the cathode will dissociate the reactive gas forming plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched sidewalls.

Reliable and repeatable temperature control of the showerhead electrode during plasma processing of semiconductor substrates is desirable for achieving desired plasma chemistry at the plasma exposed surface of the showerhead electrode. Commonly owned U.S. Published Patent Application Nos. 2009/0081878 and 2008/0308228, the disclosures of which are hereby incorporated by reference, disclose temperature control modules for showerhead electrode assemblies.

Servicing of showerhead electrodes can be difficult due to complicated mounting arrangements. Commonly assigned U.S. Non-Provisional patent application Ser. No. 12/216,524 filed on Jul. 7, 2008 discloses a monolithic showerhead electrode which is removably attached to a backing plate by a series of cam locks. In the embodiment shown, the backing plate has an annular projection housing the cam locks and the showerhead electrode has an annular recess which mates with the projection on the backing plate.

In some plasma processes, it would be desirable to provide a gas outlet pattern which distributes process gas more uniformly in the chamber.

Disclosed herein is a clamped monolithic showerhead electrode having improved gas distribution and temperature control.

SUMMARY

In accordance with one embodiment, a showerhead electrode for use in a plasma reaction chamber, includes a central portion and a peripheral portion defined by upper and lower faces of the showerhead electrode. The upper face includes a planar surface extending across the central portion and the peripheral portion and the lower face is defined by a planar inner surface extending across the central portion and a stepped outer surface extending across the peripheral portion. The stepped outer surface includes at least one annular planar surface defining an area of increased thickness of the showerhead electrode and a plurality of circumferentially spaced apart sockets are located in the upper face in the peripheral portion, the sockets configured to received cam locks therein adapted to clamp the showerhead electrode to a backing plate. A plurality of gas outlets are located in the central portion of the showerhead electrode through which process gas can be delivered to a gap between the showerhead electrode and a lower electrode on which a wafer is supported. The gas outlets are arranged in a pattern with one center gas outlet and 13 circumferentially extending rows of gas outlets with 10 gas outlets in the first row located about 0.5 inch from the center of the showerhead electrode, 18 gas outlets in the second row located about 0.9 inches from the center, 28 gas outlets in the third row located about 1.4 inches from the center, 38 gas outlets in the fourth row located about 1.8 inches from the center, 46 gas outlets in the fifth row located about 2.3 inches from the center, 56 gas outlets in the sixth row located about 2.7 inches from the center, 66 gas outlets in the seventh row located about 3.2 inches from the center, 74 gas outlets in the eighth row located about 3.6 inches from the center, 84 gas outlets in the ninth row located about 4.1 inches from the center, 94 gas outlets in the tenth row located about 4.6 inches from the center, 104 gas outlets in the eleventh row located about 5.1 inches from the center, 110 gas outlets in the twelfth row located about 5.4 inches from the center and 120 holes in the thirteenth row located about 5.7 inches from the center. A temperature sensor receiving hole in the upper face is configured to receive a temperature sensor.

The stepped outer surface can include a single step or multi-step configuration. The single step configuration includes a single annular planar surface and inner and outer inclined surfaces wherein the inner inclined surface extends between the planar inner surface and the single annular planar surface and the outer inclined surface extends between the single annular planar surface and an outer edge of the showerhead electrode.

The multi-step configuration includes inner and outer annular planar surfaces and inner, intermediate and outer inclined surfaces. The inner inclined surface extends between the planar inner surface and the inner annular planar surface, the intermediate inclined surface extends between the inner annular planar surface and the outer annular planar surface, and the outer inclined surface extends between the outer annular planar surface and an outer edge of the showerhead electrode. The thickness of the multi-stepped showerhead electrode across the planar inner surface is less than the thickness across the inner annular planar surface and the thickness across the inner annular planar surface is less than the thickness across the outer annular planar surface.

DETAILED DESCRIPTION

Figure 1:
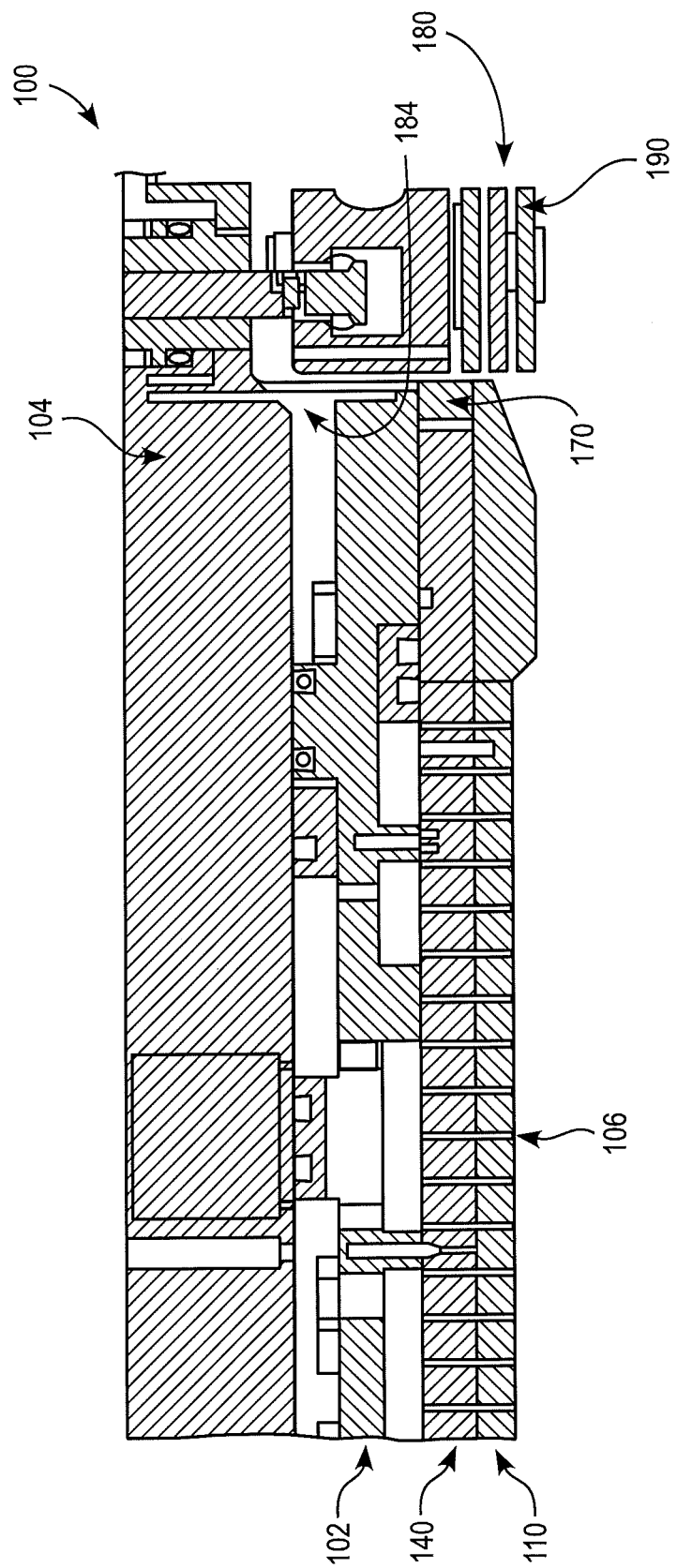
FIG. 1 shows a partial cross-sectional view of a showerhead electrode assembly.

FIG. 1 shows a partial cross-sectional view of an embodiment of a showerhead electrode assembly 100 of a plasma processing system for etching substrates. As shown in FIG. 1, the showerhead electrode assembly 100 includes a showerhead electrode 110, a backing plate 140, and a guard ring (or outer ring) 170. The showerhead electrode assembly 100 also includes a plasma confinement ring assembly (or wafer area pressure (WAP) assembly) 180, which surrounds the outer periphery of the showerhead electrode 110 and the backing plate 140.

The assembly 100 also includes a thermal control plate 102, and an upper (top) plate 104 having liquid flow channels therein and forming a temperature controlled wall of the chamber. The showerhead electrode 110 is preferably a circular plate and may be made of a conductive high purity material such as single crystal silicon, polycrystalline silicon, silicon carbide or other suitable material (such as aluminum or alloy thereof, anodized aluminum, yttria coated aluminum). A temperature sensor 580 (FIG. 5) with a suitable temperature range such as a thermocouple, a fiber optic temperature sensor or a resistive temperature detector is configured to directly contact the showerhead electrode 110. The backing plate 140 is mechanically secured to the showerhead electrode 110 with mechanical fasteners described below. The guard ring 170 surrounds the backing plate 140 and provides access to cam locking members as described below. The temperature sensor 580 outputs temperature data to a controller 581 which activates one or more heaters 582 which adjust the temperature of the showerhead electrode.

The showerhead electrode assembly 100 as shown in FIG. 1 is typically used with an electrostatic chuck (not shown) incorporating a flat lower electrode on which a wafer is supported at a distance of approximately 1 to 2 cm below the showerhead electrode 110. An example of such a plasma processing system is a parallel plate type reactor, such as the Exelan® dielectric etch systems, made by Lam Research Corporation of Fremont, Calif. Such chucking arrangements provide temperature control of the wafer by supplying backside helium (He) pressure, which controls the rate of heat transfer between the wafer and the chuck.

The showerhead electrode 110 is a consumable part which must be replaced periodically. To supply process gas to the gap between the wafer and the showerhead electrode 110, the showerhead electrode 110 is provided with gas outlets 106, which are of a size and distribution suitable for supplying a process gas, which is energized by the electrode and forms plasma in a reaction zone beneath the showerhead electrode 110.

The showerhead electrode assembly 100 also includes a plasma confinement ring assembly (or wafer area plasma (WAP) assembly) 180, which surrounds the outer periphery of the showerhead electrode 110 and the backing plate 140. The plasma confinement assembly 180 is preferably comprised of a stack or plurality of spaced-apart rings 190, which surrounds the outer periphery of showerhead electrode 110 and the backing plate 140. During processing, the plasma confinement assembly 180 causes a pressure differential in the reaction zone and increases the electrical resistance between the reaction chamber walls and the plasma thereby confining the plasma between the showerhead electrode 110 and the lower electrode (not shown).

During use, the confinement rings 190 confine the plasma to the chamber volume and controls the pressure of the plasma within the reaction chamber. The confinement of the plasma to the reaction chamber is a function of many factors including the spacing between the confinement rings 190, the pressure in the reaction chamber outside of the confinement rings and in the plasma, the type and flow rate of the gas, as well as the level and frequency of RF power. Confinement of the plasma is more easily accomplished if the spacing between the confinement rings 190 is very small. Typically, a spacing of 0.15 inches or less is required for confinement. However, the spacing of the confinement rings 190 also determines the pressure of the plasma, and it is desirable that the spacing can be adjusted to achieve the pressure required for optimal process performance while maintaining plasma. Process gas from a gas supply is supplied to showerhead electrode 110 through one or more passages in the upper plate 104 which permit process gas to be supplied to a single zone or multiple zones above the wafer.

The showerhead electrode 110 is preferably a circular plate having a uniform thickness from the center (left side of FIG. 1) to an area of increased thickness forming at least a step on the plasma exposed surface extending inwardly from an outer edge. The showerhead electrode 110 preferably has a diameter larger than a wafer to be processed, e.g., over 300 mm. The diameter of the showerhead electrode 110 can be from about 15 inches to about 17 inches for processing 300 mm wafers (as used herein, "about" refers to ±10%).

Single crystal silicon and polycrystalline silicon are preferred materials for plasma exposed surfaces of the showerhead electrode 110. High-purity, single crystal or polycrystalline silicon minimizes contamination of substrates during plasma processing as it introduces only a minimal amount of undesirable elements into the reaction chamber, and also wears smoothly during plasma processing, thereby minimizing particles. Alternative materials including composites of materials that can be used for plasma-exposed surfaces of the showerhead electrode 110 include aluminum (as used herein "aluminum" refers to pure Al and alloys thereof with or without anodized or other coated surfaces), polycrystalline silicon, yttria coated aluminum, SiC, SiN, and AlN, for example.

The backing plate 140 is preferably made of a material that is chemically compatible with process gases used for processing semiconductor substrates in the plasma processing chamber, has a coefficient of thermal expansion closely matching that of the electrode material, and/or is electrically and thermally conductive. Preferred materials that can be used to make the backing plate 140 include, but are not limited to, graphite, SiC, aluminum (Al), or other suitable materials.

The showerhead electrode 110 is attached mechanically to the backing plate 140 without any adhesive bonding between the electrode and backing plate, i.e., a thermally and electrically conductive elastomeric bonding material is not used to attach the electrode to the backing plate.

The backing plate 140 is preferably attached to the thermal control plate 102 with suitable mechanical fasteners, which can be threaded bolts, screws, or the like. For example, bolts (not shown) can be inserted in holes in the thermal control plate 102 and screwed into threaded openings in the backing plate 140. The thermal control plate 102 includes a flexure portion 184 and is preferably made of a machined metallic material, such as aluminum or the like. The upper temperature controlled plate 104 is preferably made of aluminum. The plasma confinement assembly (or wafer area plasma assembly (WAP)) 180 is positioned outwardly of the showerhead electrode assembly 100. A suitable plasma confinement assembly 180 including a plurality of vertically adjustable plasma confinement rings 190 is described in commonly owned U.S. Pat. No. 5,534,751, which is incorporated herein by reference in its entirety.

Figure 2A:
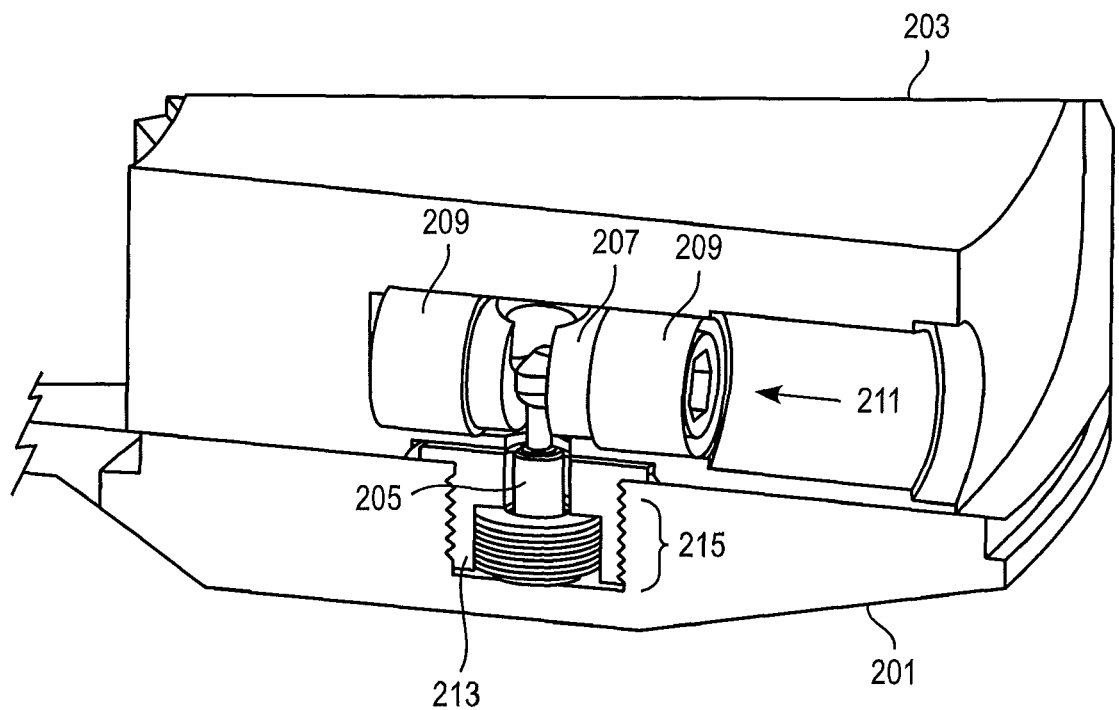
FIG. 2A is a three-dimensional representation of an exemplary cam lock for clamping a showerhead electrode in the reactor shown in FIG. 1.

The showerhead electrode 110 can be mechanically attached to the backing plate 140 by a cam lock mechanism as described in commonly-owned PCT/US2009/001593 which claims priority of U.S. application Ser. No. 61/036,862, filed Mar. 14, 2008, the disclosures of which are hereby incorporated by reference. With reference to FIG. 2A, a three-dimensional view of an exemplary cam lock electrode clamp includes portions of an electrode 201 and a backing plate 203. The electrode clamp is capable of quickly, cleanly, and accurately attaching a consumable electrode 201 to a backing plate in a variety of fab-related tools, such as the plasma etch chamber shown in FIG. 1.

The electrode clamp includes a stud (locking pin) 205 mounted into a socket 213. The stud may be surrounded by a disc spring stack 215, such, for example, stainless steel Belleville washers. The stud 205 and disc spring stack 215 may then be press-fit or otherwise fastened into the socket 213 through the use of adhesives or mechanical fasteners. The stud 205 and the disc spring stack 215 are arranged into the socket 213 such that a limited amount of lateral movement is possible between the electrode 201 and the backing plate 203. Limiting the amount of lateral movement allows for a tight fit between the electrode 201 and the backing plate 203, thus ensuring good thermal contact, while still providing some movement to account for differences in thermal expansion between the two parts. Additional details on the limited lateral movement feature are discussed in more detail, below.

In a specific exemplary embodiment, the socket 213 is fabricated from bearing-grade Torlon®. Alternatively, the socket 213 may be fabricated from other materials possessing certain mechanical characteristics such as good strength and impact resistance, creep resistance, dimensional stability, radiation resistance, and chemical resistance may be readily employed. Various materials such as polyamides, polyimides, acetals, and ultra-high molecular weight polyethylene materials may all be suitable. High temperature-specific plastics and other related materials are not required for forming the socket 213 as 230° C. is a typical maximum temperature encountered in applications such as etch chambers. Generally, a typical operating temperature is closer to 130° C.

Other portions of the electrode clamp are comprised of a camshaft 207 surrounded at each end by a pair of camshaft bearings 209. The camshaft 207 and camshaft bearing assembly is mounted into a backing plate bore 211 machined into the backing plate 203. In a typical application for an etch chamber designed for 300 mm semiconductor wafers, eight or more of the electrode clamps may be spaced around the periphery of the electrode 201/backing plate 203 combination.

The camshaft bearings 209 may be machined from a variety of materials including Torlon®, Vespel®, Celcon®, Delrin®, Teflon®, Arlon®, or other materials such as fluoropolymers, acetals, polyamides, polyimides, polytetrafluoroethylenes, and polyetheretherketones (PEEK) having a low coefficient of friction and low particle shedding. The stud 205 and camshaft 207 may be machined from stainless steel (e.g., 316, 316L, 17-7, etc.) or any other material providing good strength and corrosion resistance.

Figure 2B:
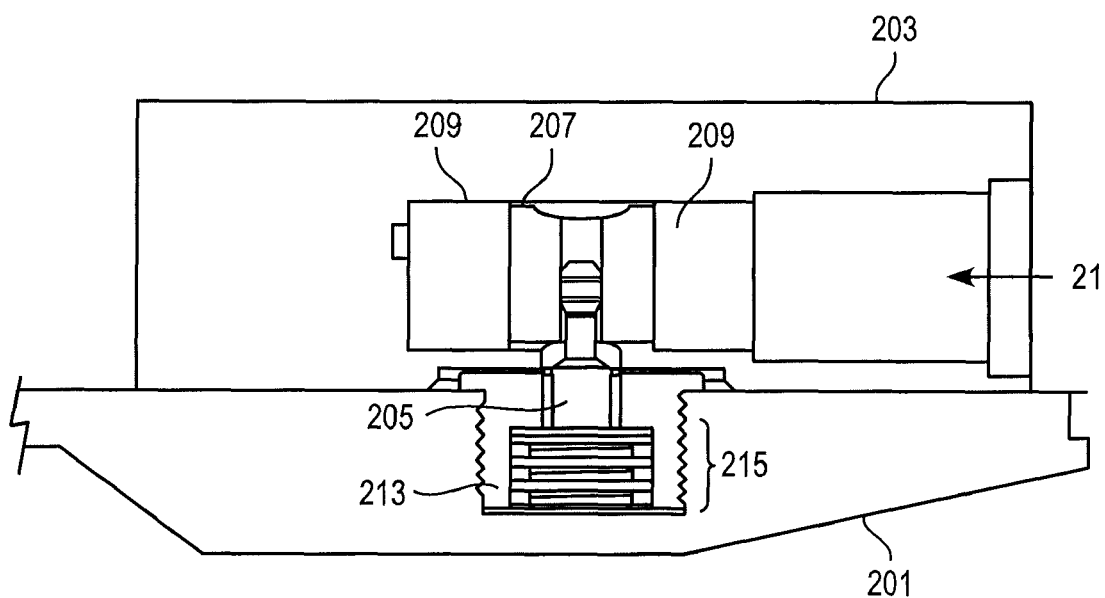
FIG. 2B is a cross-sectional view of the exemplary cam lock electrode clamp of FIG. 2A.

Referring now to FIG. 2B, a cross-sectional view of the electrode cam clamp further exemplifies how the cam clamp operates by pulling the electrode 201 in close proximity to the backing plate 203. The stud 205/disc spring stack 215/socket 213 assembly is mounted into the electrode 201. As shown, the assembly may be screwed, by means of external threads on the socket 213 into a threaded socket in the electrode 201. However, the socket may be mounted by adhesives or other types of mechanical fasteners as well.

Figure 3:
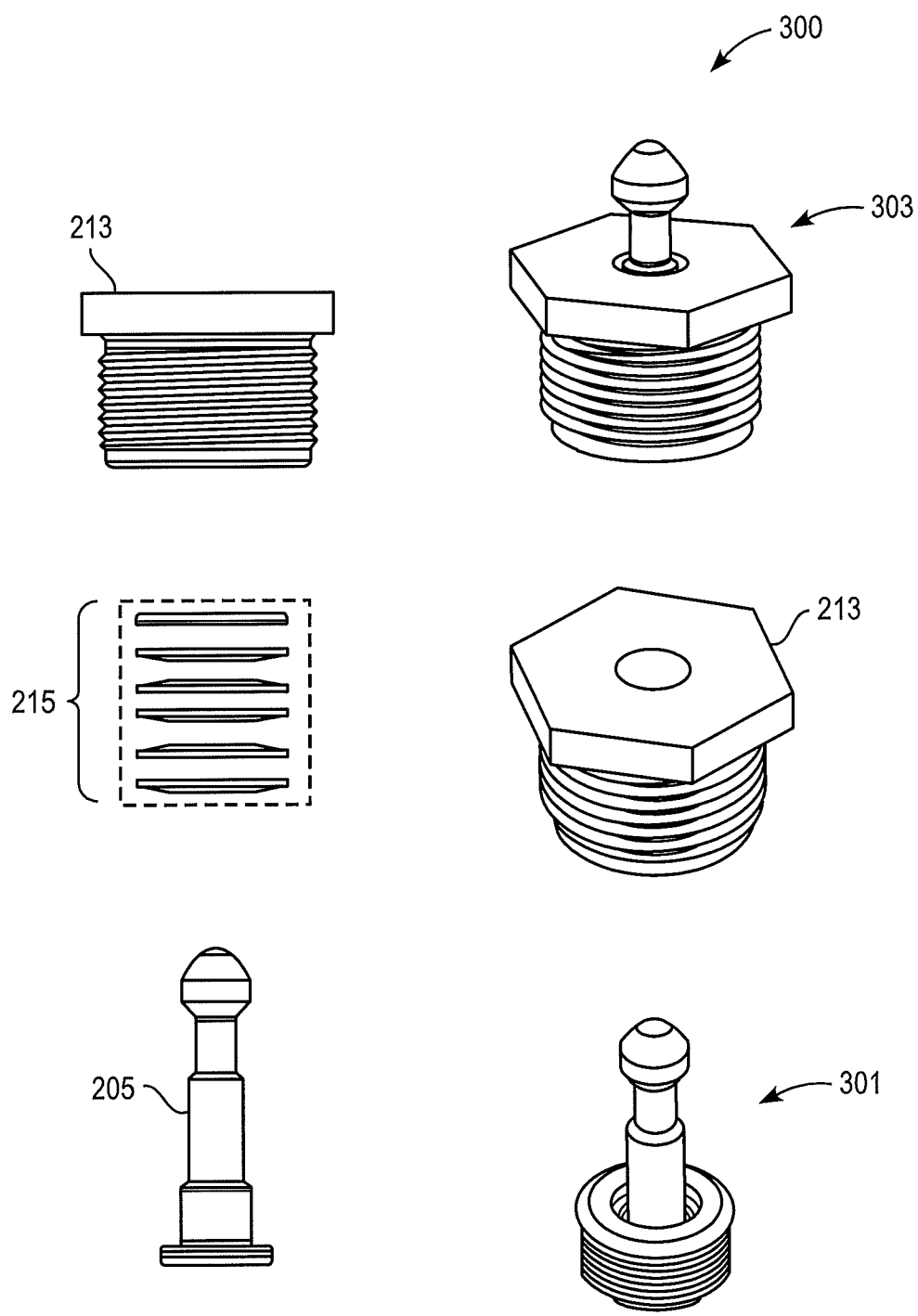
FIG. 3 shows side-elevation and assembly drawings of an exemplary locking pin used in the cam lock clamp of FIGS. 2A and 2B.

In FIG. 3, an elevation and assembly view 300 of the stud 205 having an enlarged head, disc spring stack 215, and socket 213 provides additional detail into an exemplary design of the cam lock electrode clamp. In a specific exemplary embodiment, a stud/disc spring assembly 301 is press fit into the socket 213. The socket 213 has an external thread and a hexagonal top member allowing for easy insertion into the electrode 201 (see FIGS. 2A and 2B) with light torque (e.g., in a specific exemplary embodiment, about 20 inch-pounds). As indicated above, the socket 213 may be machined from various types of plastics. Using plastics minimizes particle generation and allows for a gall-free installation of the socket 213 into a mating socket on the electrode 201.

The stud/socket assembly 303 illustrates an inside diameter in an upper portion of the socket 213 being larger than an outside diameter of a mid-section portion of the stud 205. The difference in diameters between the two portions allows for the limited lateral movement in the assembled electrode clamp as discussed above. The stud/disc spring assembly 301 is maintained in rigid contact with the socket 213 at a base portion of the socket 213 while the difference in diameters allows for some lateral movement. (See also, FIG. 2B.)

Figure 4A:
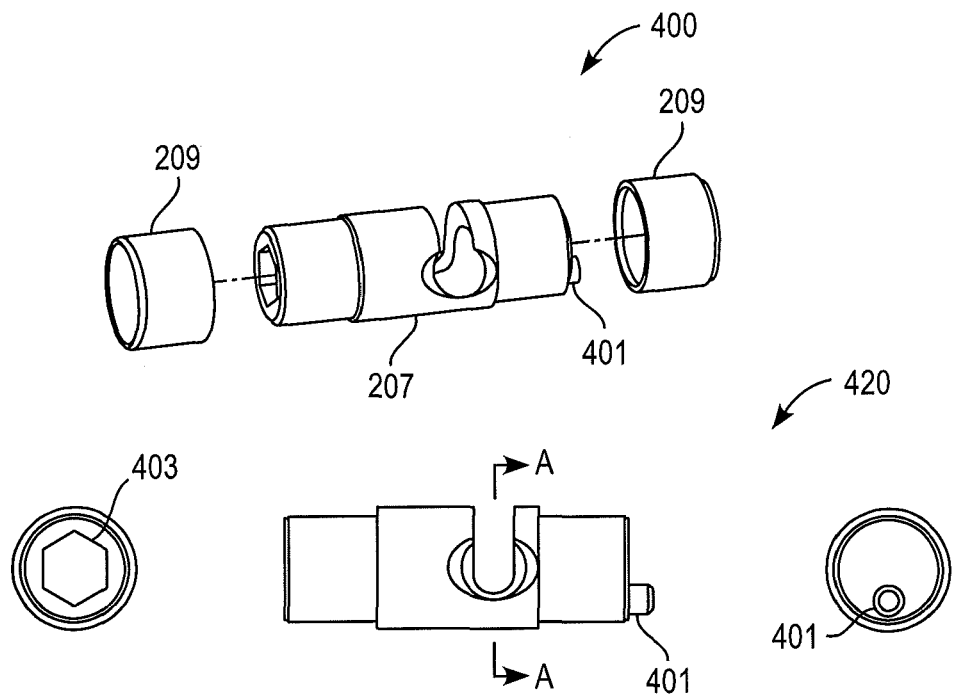
FIG. 4A shows side-elevation and assembly drawings of an exemplary cam shaft used in the cam lock clamp of FIGS. 2A and 2B.

With reference to FIG. 4A, an exploded view 400 of the camshaft 207 and camshaft bearings 209 also indicates a keying pin 401. The end of the camshaft 207 having the keying pin 401 is first inserted into the backing plate bore 211 (see FIG. 2B). A pair of small mating holes (not shown) at a far end of the backing plate bore 211 provide proper alignment of the camshaft 207 into the backing plate bore 211. A side-elevation view 420 of the camshaft 207 clearly indicates a possible placement of a hex opening 403 on one end of the camshaft 207 and the keying pin 401 on the opposite end.

For example, with continued reference to FIGS. 4A and 2B, the electrode cam clamp is assembled by inserting the camshaft 207 into the backing plate bore 211. The keying pin 401 limits rotational travel of the camshaft 207 in the backing plate bore 211 by interfacing with one of the pair of small mating holes. The camshaft may first be turned in one direction though use of the hex opening 403, for example, counter-clockwise, to allow entry of the stud 205 into the camshaft 207, and then turned clockwise to fully engage and lock the stud 205. The clamp force required to hold the electrode 201 to the backing plate 203 is supplied by compressing the disc spring stack 215 beyond their free stack height. The camshaft 207 has an internal eccentric internal cutout which engages the enlarged head of the shaft 205. As the disc spring stack 215 compresses, the clamp force is transmitted from individual springs in the disc spring stack 215 to the socket 213 and through the electrode 201 to the backing plate 203.

In an exemplary mode of operation, once the camshaft bearings are attached to the camshaft 207 and inserted into the backing plate bore 211, the camshaft 207 is rotated counter-clockwise to its full rotational travel. The stud/socket assembly 303 (FIG. 3) is then lightly torqued into the electrode 201. The head of the stud 205 is then inserted into the vertically extending through hole below the horizontally extending backing plate bore 211. The electrode 201 is held against the backing plate 203 and the camshaft 207 is rotated clockwise until either the keying pin drops into the second of the two small mating holes (not shown) or an audible click is heard (discussed in detail, below). The exemplary mode of operation may be reversed to dismount the electrode 201 from the backing plate 203. However, features such as the audible click are optional in the cam lock arrangement.

Figure 4B:
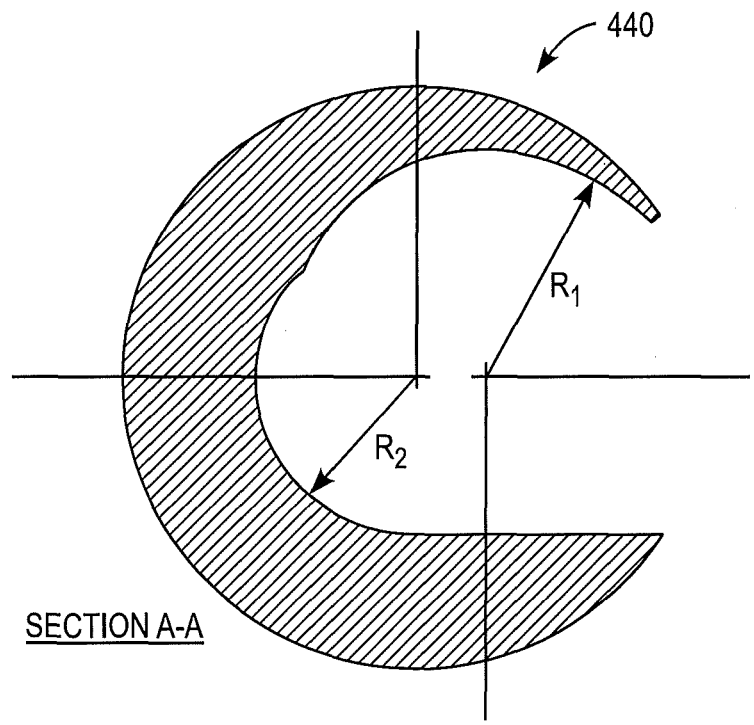
FIG. 4B shows a cross-sectional view of an exemplary cutter-path edge of a portion of the cam shaft of FIG. 4A.

With reference to FIG. 4B, a sectional view A-A of the side-elevation view 420 of the camshaft 207 of FIG. 4A indicates a cutter path edge 440 by which the head of the stud 205 is fully secured. In a specific exemplary embodiment, the two radii $R_1$ and $R_2$ are chosen such that the head of the stud 205 makes the optional audible clicking noise described above to indicate when the stud 205 is fully secured.

Figure 5:
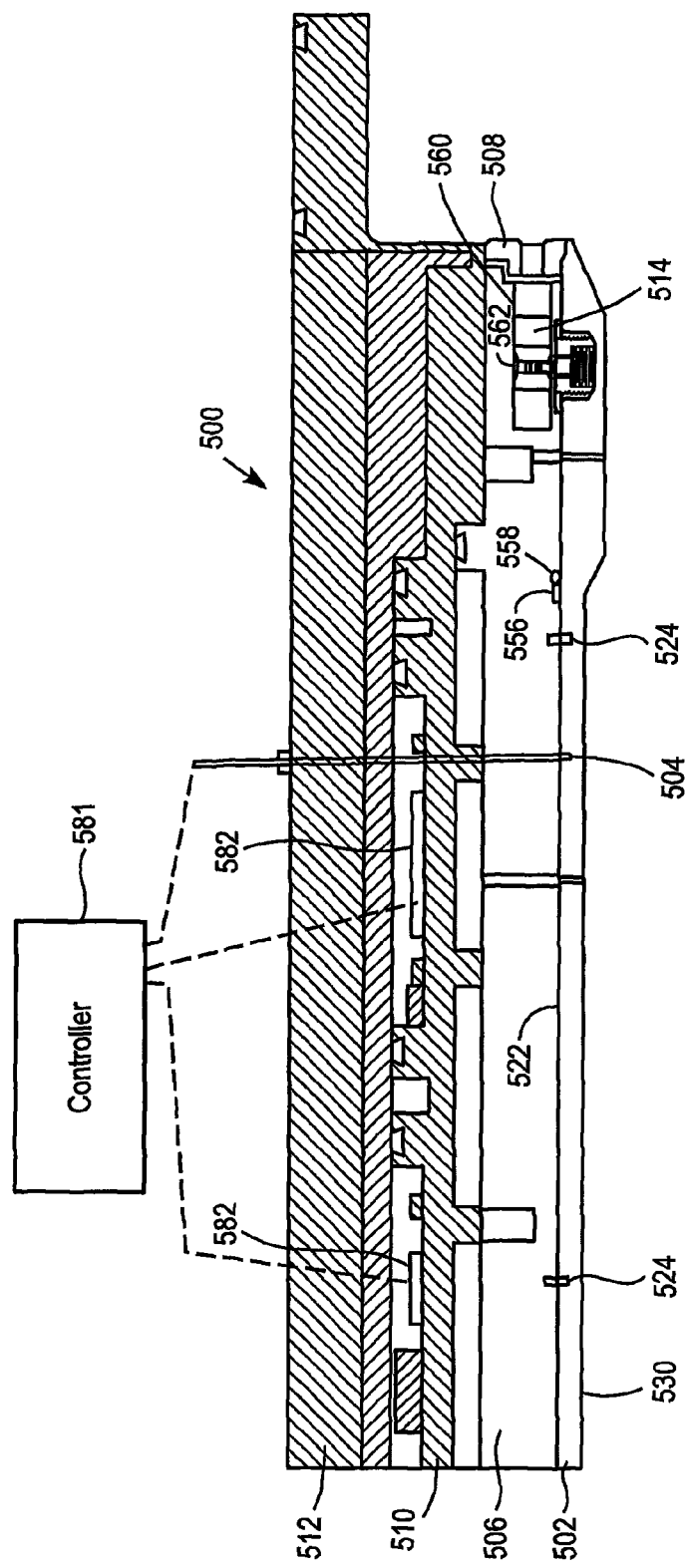
FIG. 5 shows a showerhead electrode assembly with a showerhead electrode, backing plate, thermal control plate, guard ring and top plate.

FIG. 5 illustrates a showerhead electrode assembly 500 for a capacitively coupled plasma chamber which includes the following features: (a) a cam-locked non-bonded showerhead electrode 502; (b) a backing plate 506; and (c) a guard ring 508 which allows access to cam locks holding the electrode to the backing plate 506.

The electrode assembly 500 includes a thermal control plate 510 bolted from outside the chamber to a temperature controlled top wall 512 of the chamber. The showerhead electrode 502 is releasably attached to the backing plate 506 from inside the chamber by cam-lock mechanisms 514 described earlier with reference to FIGS. 2-4.

In a preferred embodiment, the showerhead electrode 502 of the electrode assembly 500 can be disassembled by (a) rotating the guard ring 508 to a first position aligning four holes in the guard ring 508 with four cam locks 514 located at spaced positions in the outer portion of the backing plate 506; (b) inserting a tool such as an alien wrench through each hole in the guard ring 508 and rotating each cam lock 514 to release a vertically extending locking pin 562 of each respective cam lock 514; (c) rotating the guard ring 508 90° to a second position aligning the four holes in the guard ring 508 with another four cam locks 514; and (d) inserting a tool such as an alien wrench through each hole in the guard ring 508 and rotating each respective cam lock 514 to release a locking pin 562 of each respective cam lock 514; whereby the showerhead electrode 502 can be lowered and removed from the plasma chamber.

FIG. 5 also shows a cross-sectional view of one of the cam lock arrangements wherein a rotatable cam lock 514 is located in a horizontally extending bore 560 in an outer portion of the backing plate 506. The cylindrical cam lock 514 is rotatable by a tool such as an allen wrench to (a) a lock position at which an enlarged end of a locking pin 562 is engaged by a cam surface of the cam lock 514 which lifts the enlarged head of the locking pin or (b) a release position at which the locking pin 562 is not engaged by the cam lock 514. The backing plate 506 includes vertically extending bores in its lower face through which the locking pins 562 are inserted to engage the cam locks 514.

The showerhead electrode 502 is preferably a plate of high purity (less than 10 ppm impurities) low resistivity (0.005 to 0.02 ohm-cm) single crystal silicon. The showerhead electrode assembly 500 includes three alignment pins 524 engaged in three alignment pin holes 521 in the upper face 522 of the showerhead electrode 502, one or more O-rings 558 and a plurality of thermal gaskets such as Q-pads 556 between the showerhead electrode 502 and the backing plate 506. Each Q-pad 566 has projections engaged in recesses 520 in the upper face 522. Details of such gaskets are disclosed in commonly owned U.S. application Ser. No. 12/421,845 filed Apr. 10, 2009, the disclosure of which is hereby incorporated by reference. The plasma exposed surface 530 on the showerhead electrode 502 faces the substrate being processed in the chamber.

Figure 6A:
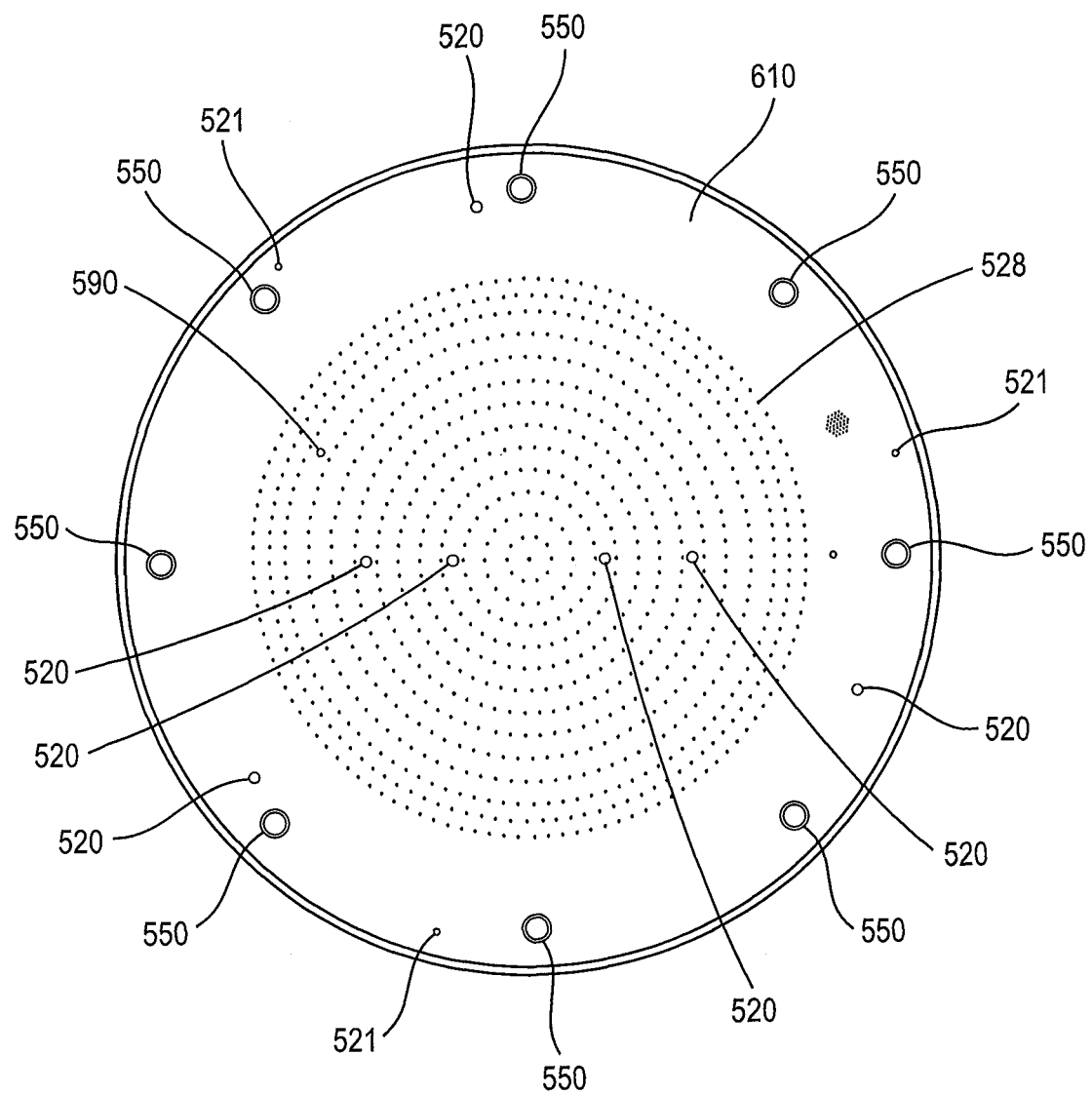
FIG. 6A is a top view of the showerhead electrode.
Figure 6B:
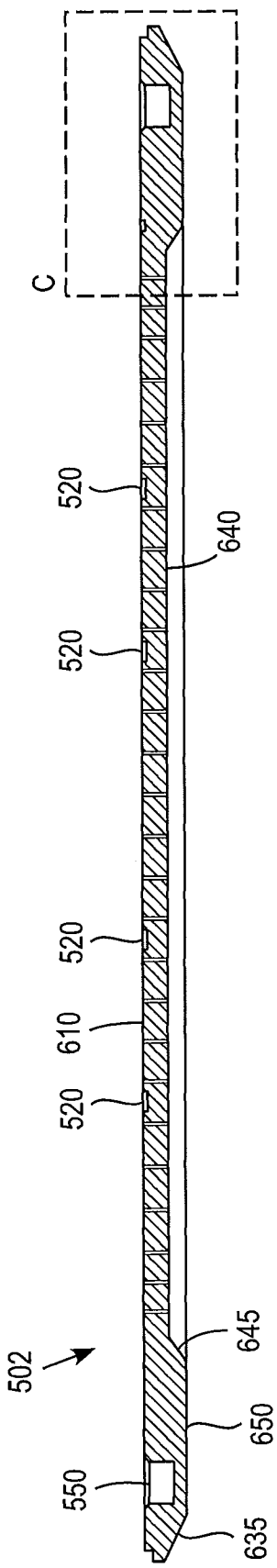
FIG. 6B is a cross-section view of the showerhead electrode according to one embodiment of the showerhead electrode.
Figure 6D:
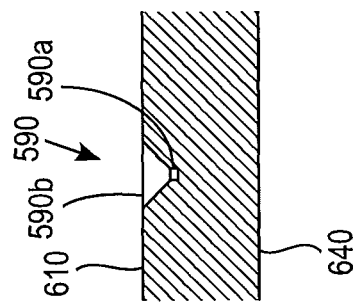
FIG. 6D is partial cross-sectional view of the showerhead electrode through a recess for receipt of a temperature sensor.
Figure 6C:
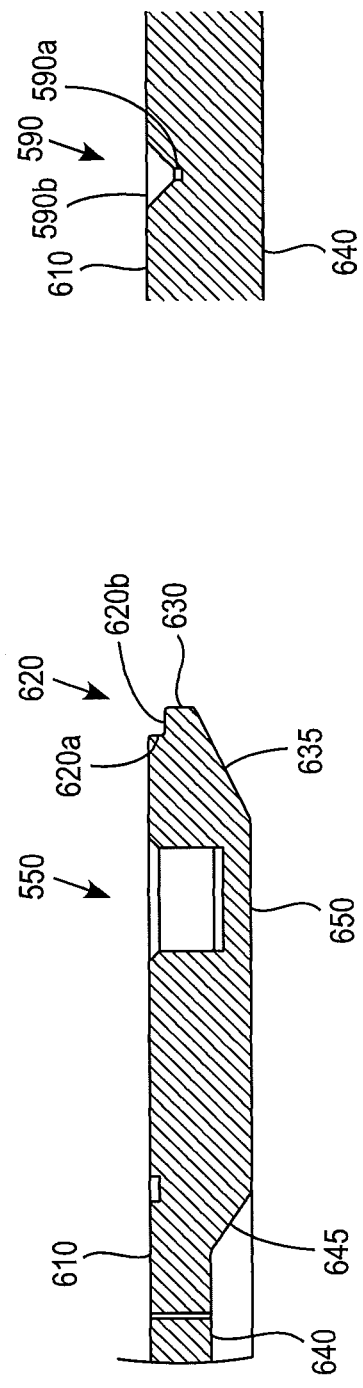
FIG. 6C is an enlarged view of the portion C in FIG. 6B.

FIGS. 6A and 6C show the mounting surface and a partial cross-sectional view of the showerhead electrode 502. The mounting surface has a planar surface 610 extending nearly to the outer edge and a narrow annular outer ledge 620 recessed from the planar surface 610 and in the outer edge of the showerhead electrode 502. The annular outer ledge 620 supports an annular projection of the guard ring 508. The planar surface 610 has an outer diameter of about 16.75 inches. The annular outer ledge 620 has an inner diameter of about 16.75 inches, an outer diameter of about 17 inches, a vertical surface 620a of about 0.076 inch long, and a horizontal surface 620b of about 0.124 inch. Eight 0.5 inch diameter sockets 550 having depths of 0.325 inch are disposed near the edge of the mounting surface for receiving locking pins 562. The sockets 550 are equidistant from each other and located on a radius about 7.62 inches from the center.

The planar surface 610 comprises three 0.116 inch diameter alignment pin holes 521 having depths of about 0.2 inch located at a distance of about 7.93 inches from the center and seven 0.215 inch diameter recesses 520 having depths of about 0.04 inch for receiving the projections on the three Q-pads 556. Two recesses 520 are located at a distance of about 1.59 inches from the center and azimuthally offset by 180° from each other. Another two recesses 520 are located at a distance of about 3.39 inches from the center and azimuthally offset by 180° from each other. Another three recesses 520 are located at a distance of about 7.30 inches from the center and azimuthally offset by 120° from each other.

The planar surface 610 further comprises a hole 590 for receiving a temperature sensor 580. The hole 590 is located at a distance of about 4.83 inches from the center. In a preferred embodiment as shown in FIG. 6D, the hole 590 has a depth of at most 0.08 inch; the hole 590 comprises a cylindrical side surface 590a with a diameter of at most 0.029 inch and a height of about 0.0035 inch at the base of the hole 590, and a truncated conical side surface 590b with a circular base of about 0.153 inch in diameter and an opening angle of about 90°, the truncated conical side surface 590b extending between the cylindrical side surface and the mounting surface. A temperature sensor (thermocouple) 580 extending through openings in the top plate, the thermal control plate and the backing plate includes a tip which is spring biased in the bottom 590a of hole 590. The conical surface 590b centers the tip of the sensor 580 in the bottom of the hole 590.

Gas outlets 528 extend from the mounting surface to the plasma exposed surface and can be arranged in any suitable pattern. In the embodiment shown, 849 gas outlet holes 528 having diameters of 0.017 inch are arranged in a pattern of one center gas outlet and 13 circumferentially extending rows of gas outlets with 10 gas outlets in the first row located about 0.5 inch from the center of the electrode, 18 gas outlets in the second row located about 0.9 inches from the center, 28 gas outlets in the third row located about 1.4 inches from the center, 38 gas outlets in the fourth row located about 1.8 inches from the center, 46 gas outlets in the fifth row located about 2.3 inches from the center, 56 gas outlets in the sixth row located about 2.7 inches from the center, 66 gas outlets in the seventh row located about 3.2 inches from the center, 74 gas outlets in the eighth row located about 3.6 inches from the center, 84 gas outlets in the ninth row located about 4.1 inches from the center, 94 gas outlets in the tenth row located about 4.6 inches from the center, 104 gas outlets in the eleventh row located about 5.1 inches from the center, 110 gas outlets in the twelfth row located about 5.4 inches from the center and 120 holes in the thirteenth row located about 5.7 inches from the center.

As shown in FIG. 6C, a single stepped showerhead electrode 502 has a plasma exposed surface which includes a circular inner surface 640 with a diameter of about 12 inches, an annular outer surface 650 with an inner diameter of about 12.55 inches and an outer diameter of about 16 inches, an inner inclined surface 645 extending between the circular inner surface 640 and the annular outer surface 650 at an angle of about 145° with respect to the surface 640, and outer inclined surface 635 extending between the annular outer surface 650 and a cylindrical peripheral surface 630 of the showerhead electrode 502 at an angle of about 155° with respect to the surface 650. The thickness between the annular outer surface 650 and the surface 610 is about 0.44 inch. The thickness between the circular inner surface 640 and the surface 610 is about 0.26 inch.

Figure 6E:
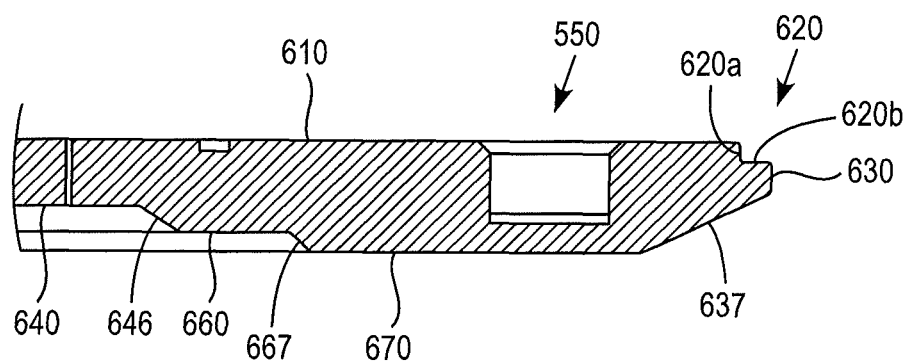
FIG. 6E is a partial cross-sectional view of another embodiment of the showerhead electrode.

A multi-stepped showerhead electrode 502 is shown in FIG. 6E wherein the plasma exposed surface includes a circular inner surface 640 with a diameter of about 12 inches, an inner annular surface 660 with an inner diameter of about 12.2 inches and an outer diameter of about 13.2 inches, an outer annular surface 670 with an inner diameter of about 13.4 inches and an outer diameter of about 16 inches, an inner inclined surface 646 extending between the circular inner surface 640 and the inner annular surface 660 at an angle of about 145° with respect to the surface 640, an intermediate inclined surface 667 extending between the inner annular surface 660 and the outer annular surface 670 at an angle of about 135° with respect to the surface 670, and an outer inclined surface 637 extending between the outer annular surface 670 and a cylindrical peripheral surface 630 of the showerhead electrode at an angle of about 155° with respect to the surface 670. The thickness between the outer annular surface 670 and the surface 610 is about 0.44 inch. The thickness between the inner annular surface 660 and the surface 610 is about 0.36 inch. The thickness between the circular inner surface 640 and the surface 610 is about 0.26 inch.

Figure 6F:
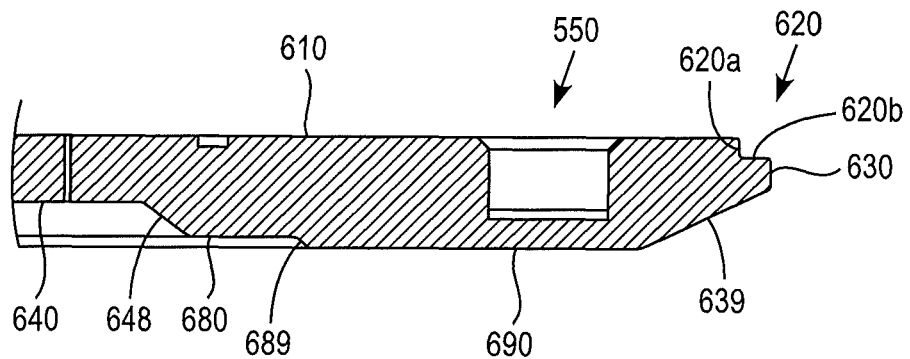
FIG. 6F is a partial cross-sectional view of yet another embodiment of the showerhead electrode.

In yet another embodiment of the multi-stepped showerhead electrode 502, whose cross section is shown in FIG. 6F, the plasma exposed surface includes a circular inner surface 640 with a diameter of about 12 inches, an inner annular surface 680 with an inner diameter of about 12.4 inches and an outer diameter of about 13.3 inches, an outer annular surface 690 with an inner diameter of about 13.4 inches and an outer diameter of about 16 inches, an inner inclined surface 648 extending between the circular inner surface 640 and the inner annular surface 680 at an angle of about 145° with respect to the surface 640, an intermediate inclined surface 689 extending between the inner annular surface 680 and the outer annular surface 690 at an angle of about 135° with respect to the surface 690, and an outer inclined surface 639 extending between the outer annular surface 690 and a cylindrical peripheral surface 630 of the showerhead electrode 502 at an angle of about 155° with respect to the surface 690. The thickness between the outer annular surface 690 and the surface 610 is about 0.44 inch. The thickness between the inner annular surface 680 and the surface 610 is about 0.40 inch. The thickness between the circular inner surface 640 and the surface 610 is about 0.26 inch.

Figure 7:
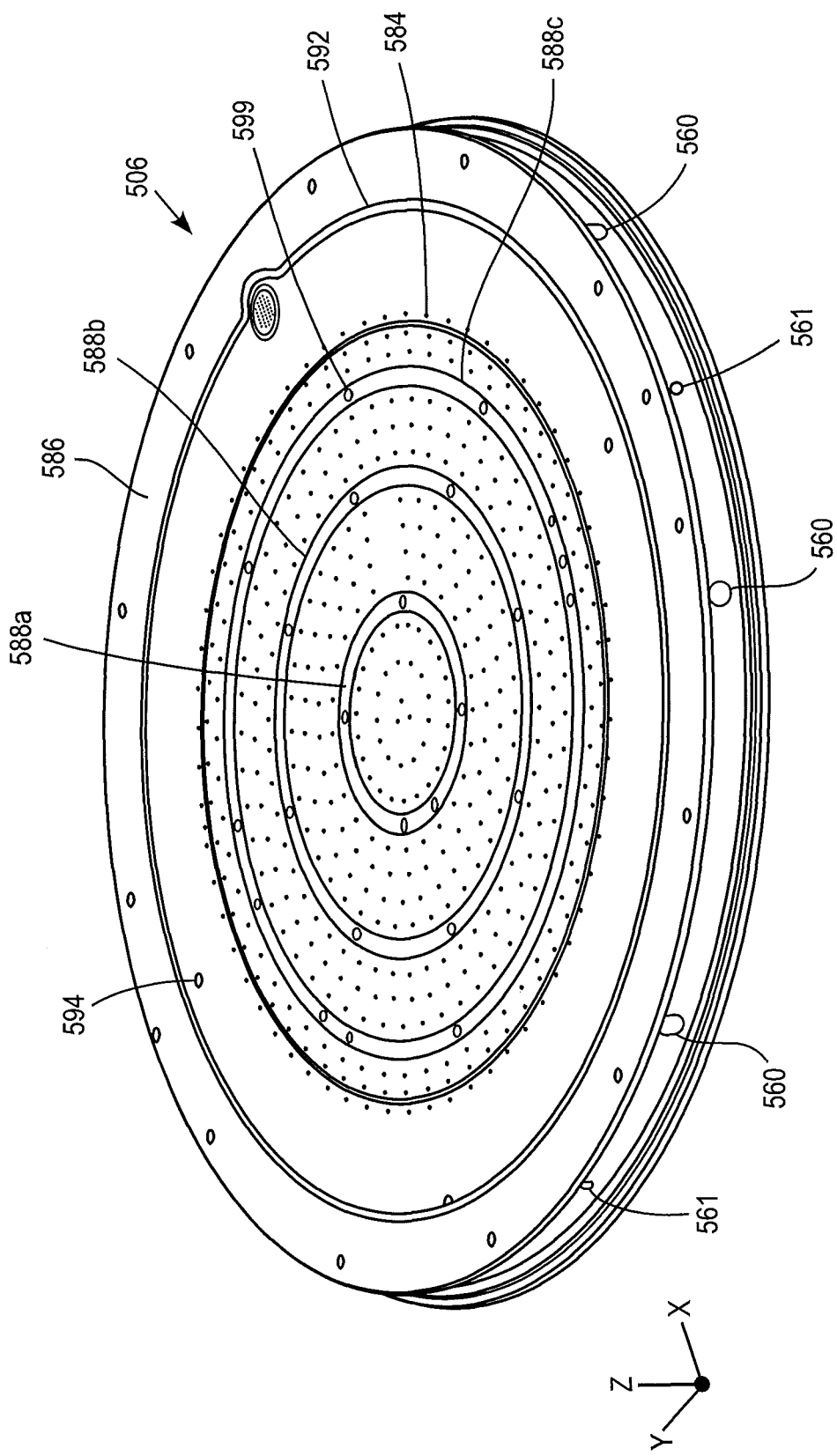
FIG. 7 is a perspective view of the backing plate backing plate shown in FIG. 5. The gas passage pattern and alignment pin hole pattern shown are not exact.

FIG. 7 is a perspective view of backing plate 506. The backing plate 506 includes a center gas passage and 13 rows of gas passages 584 which align with the outlets 528 in the showerhead electrode 502. The upper face 586 of the backing plate includes three annular regions 588a, 588b, 588c which contact annular projections of the thermal control plate 510. The thermal control plate can be attached to the top wall of the plasma chamber by fasteners extending through the top wall into the thermal control plate as disclosed in commonly-assigned U.S. Patent Publication Nos. 2005/0133160, 2007/0068629, 2007/0187038, 2008/0087641 and 2008/0090417, the disclosures of which are hereby incorporated in their entirety. Threaded openings 599 are located in an outer periphery of the upper face 586 and the annular regions 588a, 588b, 588c to receive fasteners extending through openings in the top plate 512 and thermal control plate 510 to hold the backing plate 506 in contract with the thermal control plate 510. See, for example, commonly-assigned U.S. Patent Publication No. 2008/0087641 for a description of fasteners which can accommodate thermal cycling. A groove 592 in the upper face 586 receives an O-ring which provides a gas seal between the backing plate 506 and the thermal control plate 510. Alignment pin bores 594 in the upper face 586 receive alignment pins which fit into alignment pin bores in the thermal control plate. Horizontally extending threaded openings 561 at positions between bores 560 receive dielectric fasteners used to prevent the guard ring 508 from rotating and plug the access bores in the guard ring 508 after assembly of the showerhead electrode 512.

Figure 8:
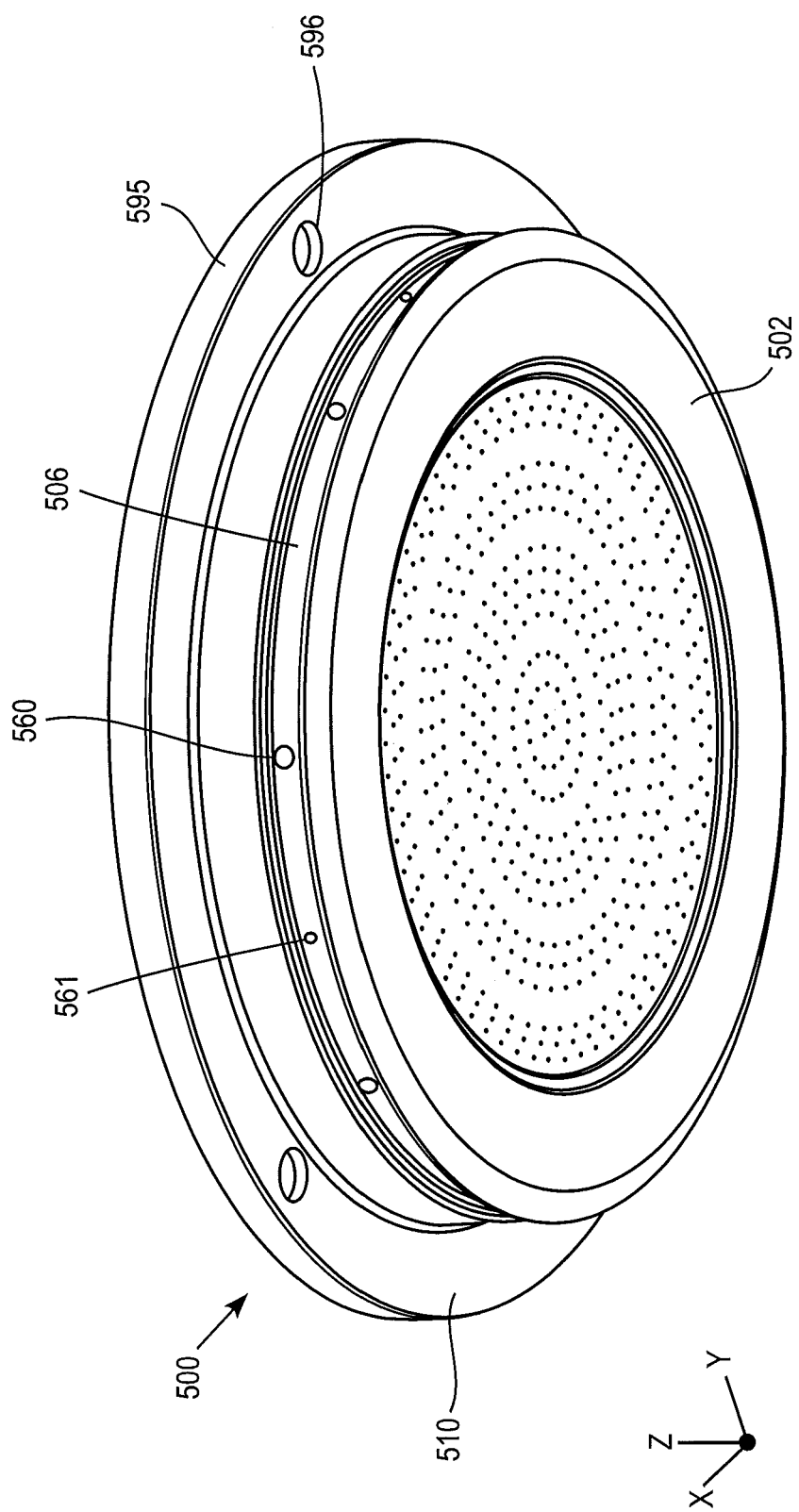
FIG. 8 is a perspective view of the showerhead electrode assembly without the guard ring. The gas passage pattern shown is not exact.

FIG. 8 is a perspective view of the showerhead electrode assembly 500 with the guard ring 508 removed. As explained earlier, the guard ring 508 can be rotated to one or more assembly positions at which the cam locks 514 can be engaged and rotated to a lock position at which dielectric fasteners can be inserted into openings 561 to maintain the guard ring out of contact with the outer periphery of the backing plate and thus allow for thermal expansion of the backing plate. The thermal control plate includes a flange 595 with openings 596 through which actuators support the plasma confinement rings. Details of the mounting arrangement of plasma confinement ring assemblies can be found in commonly-assigned U.S. Patent Publication No. 2006/0207502 and 2006/0283552, the disclosures of which are hereby incorporated in their entirety.

The mounting surface 610 of the showerhead electrode abuts an opposed surface of the backing plate 506 as a result of the clamping force exerted by the 8 locking pins held by the 8 cam locks in the backing plate. The guard ring 508 covers the mounting holes in the backing plate 506 and the access openings in the guard ring are filled with removable inserts made of plasma resistant polymer material such as Torlon®, Vespel®, Celcon®, Delrin®, Teflon®, Arlon®, or other materials such as fluoropolymers, acetals, polyamides, polyimides, polytetrafluoroethylenes, and polyetheretherketones (PEEK) having a low coefficient of friction and low particle shedding.

With reference to FIG. 5, electrical and thermal contact between the backing plate 506 and showerhead electrode 502 is provided by gaskets such as Q-pads 556 located at the outer periphery of the electrode and at one or more locations inward of the outer Q-pad. For example, O-pads having diameters of about 3.2, 6.8 and 12 inches can be used. Commonly-owned U.S. application Ser. No. 11/896,375, filed Aug. 31, 2007, includes details of Q-pads, the disclosure of which is hereby incorporated by reference. To provide different process gas mixtures and/or flow rates, one or more optional gas partition seals can be provided across the upper face of the electrode. For example, a single O-ring can be provided between the showerhead electrode 502 and the backing plate 506 at a location between inner and outer Q-pads to separate an inner gas distribution zone from an outer gas distribution zone. An O-ring 558 located between the showerhead electrode 502 and the backing plate 506 along the inner periphery of the outer Q-pad can provide a gas and particle seal between the electrode and backing plate.

While the invention has been described in detail with reference to specific embodiments thereof, it will be apparent to those skilled in the art that various changes and modifications can be made, and equivalents employed, without departing from the scope of the appended claims.

We claim:

1. A showerhead electrode for use in a plasma reaction chamber, said showerhead electrode comprising:
 a central portion and a peripheral portion defined by upper and lower faces of the showerhead electrode, the upper face including a planar surface extending across the central portion and the peripheral portion, the lower face defined by a planar inner surface extending across the central portion and a stepped outer surface extending across the peripheral portion, the stepped outer surface including at least one annular planar surface defining an area of increased thickness of the showerhead electrode;
 a plurality of circumferentially spaced apart sockets in the upper face in the peripheral portion, the sockets configured to received cam locks therein adapted to clamp the showerhead electrode to a backing plate;
 a plurality of gas outlets in the central portion of the showerhead electrode through which process gas can be delivered to a gap between the showerhead electrode and a lower electrode on which a wafer is supported, the gas outlets being arranged in a pattern with one center gas outlet and 13 circumferentially extending rows of gas outlets with 10 gas outlets in the first row located about 0.5 inch from the center of the showerhead electrode, 18 gas outlets in the second row located about 0.9 inches from the center, 28 gas outlets in the third row located about 1.4 inches from the center, 38 gas outlets in the fourth row located about 1.8 inches from the center, 46 gas outlets in the fifth row located about 2.3 inches from the center, 56 gas outlets in the sixth row located about 2.7 inches from the center, 66 gas outlets in the seventh row located about 3.2 inches from the center, 74 gas outlets in the eighth row located about 3.6 inches from the center, 84 gas outlets in the ninth row located about 4.1 inches from the center, 94 gas outlets in the tenth row located about 4.6 inches from the center, 104 gas outlets in the eleventh row located about 5.1 inches from the center, 110 gas outlets in the twelfth row located about 5.4 inches from the center and 120 holes in the thirteenth row located about 5.7 inches from the center; and
 a temperature sensor receiving hole in the upper face configured to receive a tip of a temperature sensor.

2. The showerhead electrode as claimed in claim 1, further comprising alignment pin holes in the upper face, the alignment pin holes configured to align with alignment pins extending into the backing plate and the temperature sensor receiving hole located between the tenth and eleventh rows of gas outlets.

3. The showerhead electrode as claimed in claim 1, further comprising a confined pattern of gas outlets in the stepped outer surface adapted to cooperate with a manometer unit to provide vacuum pressure measurements in the chamber.

4. The showerhead electrode as claimed in claim 1, wherein the upper face of the showerhead electrode includes an annular ledge in an outer edge thereof, the ledge configured to support a guard ring such that an outer surface of the guard ring is flush with an outer surface of the showerhead electrode.

5. The showerhead electrode as claimed in claim 1, wherein the stepped outer surface includes a single annular planar surface, inner and outer inclined surfaces, the inner inclined surface extending between the planar inner surface and the single annular planar surface, the outer inclined surface extending between the single annular planar surface and an outer edge of the showerhead electrode.

6. The showerhead electrode as claimed in claim 1, wherein the stepped outer surface includes inner and outer annular planar surfaces, inner, intermediate and outer inclined surfaces, the inner inclined surface extending between the planar inner surface and the inner annular planar surface, the intermediate inclined surface extending between the inner annular planar surface and the outer annular planar surface, and the outer inclined surface extending between the outer annular planar surface and an outer edge of the showerhead electrode; the thickness of the showerhead electrode across the planar inner surface is less than the thickness of the showerhead electrode across the inner annular planar surface; and the thickness of the showerhead electrode across the inner annular planar surface is less than the thickness of the showerhead electrode across the outer annular planar surface.

7. A showerhead electrode assembly comprising:
the showerhead electrode as claimed in claim 1;
a backing plate including axially extending bores aligned with the sockets in the showerhead electrode and radially extending bores communicating with the axially extending bores;
rotatable camshafts mounted in the radially extending bores;
locking pins located in the sockets in the showerhead electrode, the locking pins including enlarged heads at free ends thereof, the camshafts including cutouts adapted to engage and lock the heads of the locking pins so as to mechanically clamp the showerhead electrode to the backing plate.

8. The showerhead electrode assembly as claimed in claim 7, wherein bases of the locking pins are located in sockets, the sockets including threads on an outer surface thereof engaged with threads on the inner surface of the sockets, the sockets including flanges which engage the upper face of the showerhead electrode, the axially extending bores in the backing plate including wide portions and narrow portions, the wide portions receiving the flanges and the narrow portions receiving the locking pins.

9. The showerhead electrode assembly as claimed in claim 8, wherein the locking pins are movable axially and laterally in the sockets to accommodate differential thermal expansion of the backing plate and the showerhead electrode.

10. The showerhead electrode assembly as claimed in claim 8, wherein the showerhead electrode is a plate of polycrystalline silicon, single crystal silicon, silicon carbide, aluminum, anodized aluminum or yttria coated aluminum and the backing plate is a plate of aluminum.

11. The showerhead electrode assembly as claimed in claim 8, wherein the backing plate is free of thermal control coolant passages and heating elements.

12. The showerhead electrode assembly as claimed in claim 7, further comprising a temperature sensor in direct contact with the temperature sensor receiving hole in the upper face of the showerhead electrode.

13. The showerhead electrode assembly as claimed in claim 12, further comprising a thermal control plate attached to the backing plate, the thermal control plate having annular projections on a lower surface thereof defining gas plenums in communication with gas passages in the backing plate and one or more heating elements actively controlled by a controller which activates the one or more heating elements to adjust the temperature of the showerhead electrode based on data received from the temperature sensor.

14. The showerhead electrode assembly as claimed in claim 7, further comprising a gas seal between the backing plate and the showerhead electrode, the gas seal being located outwardly of the gas passages and a plurality of annular gaskets inwardly of the gas seal.

15. A method of treating a semiconductor substrate in a plasma chamber, said method comprising the steps of:
supporting the semiconductor substrate on a bottom electrode in the chamber;
supplying process gas to the chamber;
forming a plasma adjacent an exposed surface of a showerhead electrode; and
processing the semiconductor substrate with the plasma;
wherein the showerhead electrode comprises the showerhead electrode as claimed in claim 1.

16. The method as claimed in claim 15, wherein temperature of the showerhead electrode is measured by a temperature sensor in direct contact with the showerhead electrode and controlled by one or more heating elements which heat a thermal control plate based on data received from the temperature sensor, the thermal control plate including annular projections forming plenums between the thermal control plate and the backing plate, the plenums in fluid communication with gas passages in the backing plate aligned with the gas outlets in the showerhead electrode, the backing plate providing a thermal path between the showerhead electrode and the thermal control plate.

17. The method as claimed in claim 15, wherein the semiconductor substrate comprises a semiconductor wafer and the processing step comprises etching the semiconductor wafer with the plasma.

18. The method as claimed in claim 15, wherein the showerhead electrode is grounded and the bottom electrode is powered during the processing step.

19. The method as claimed in claim 15, comprising heating the showerhead electrode and backing plate to an elevated temperature which causes differential thermal expansion of the showerhead electrode and the backing plate, and accommodating the thermal expansion by movement of the locking pins.

20. A method of replacing a showerhead electrode of the showerhead electrode assembly as claimed in claim 7, comprising releasing cam locks to disengage the camshafts from the locking pins, removing the showerhead electrode, aligning locking pins of a new or refurbished showerhead electrode with the axial bores in the backing plate, and rotating the camshafts to engage the heads of the locking pins.

* * * * *